US008587014B2

(12) United States Patent
Song

(10) Patent No.: US 8,587,014 B2
(45) Date of Patent: Nov. 19, 2013

(54) LED PACKAGING STRUCTURE WITH BLIND HOLE WELDING DEVICE

(75) Inventor: Wen-Joe Song, Jhonghe (TW)

(73) Assignee: Kingbright Electronic Co., Ltd., Jhonghe (TW)

( * ) Notice: Subject to any disclaimer, the term of this patent is extended or adjusted under 35 U.S.C. 154(b) by 60 days.

(21) Appl. No.: 12/396,338

(22) Filed: Mar. 2, 2009

(65) Prior Publication Data

US 2010/0219443 A1    Sep. 2, 2010

(51) Int. Cl.
*H01L 33/00* (2010.01)

(52) U.S. Cl.
USPC .................................. 257/99; 257/E33.066

(58) Field of Classification Search
USPC .......................................................... 257/99
See application file for complete search history.

(56) References Cited

U.S. PATENT DOCUMENTS

| 2005/0116235 A1* | 6/2005 | Schultz et al. ................. 257/79 |
| 2007/0019416 A1* | 1/2007 | Han et al. ..................... 362/307 |
| 2009/0008656 A1* | 1/2009 | Wang et al. .................... 257/91 |

* cited by examiner

*Primary Examiner* — Jarrett Stark
*Assistant Examiner* — Lawrence Tynes, Jr.
(74) *Attorney, Agent, or Firm* — Rosenberg, Klein & Lee

(57) ABSTRACT

The present invention provides a LED packaging structure, and more particularly to an innovative one designed with blind hole welding device. It at least comprises: a packaging body, which is provided with a wiring substrate; metal layers are separately arranged at both sides for coating the wiring substrate; the metal layers are divided into three portions, i.e. metal layer 1, 2, 3, according to the electrical connection point; a plurality of blind holes arranged at bottom of the wiring substrate, and then connected with metal layer 3; a single or a plurality of LED chips arranged onto the wiring substrate; a colloid coated on the LED chip; the packaging body is welded directly onto the substrate for electrical connection, so that LED chip is highlighted. The blind hole is arranged to facilitate the welding, helping to improve the electrical connection and welding performance.

8 Claims, 4 Drawing Sheets

LED PACKAGING STRUCTURE WITH BLIND HOLE WELDING DEVICE

FIELD OF THE INVENTION

The present invention relates generally to a LED packaging structure, and more particularly to an innovative one which is designed with blind hole welding device.

DESCRIPTION OF RELATED ART

The conventional packaging structure of LED is shown in FIG. 1, wherein it comprises a substrate 1, at both sides of which metal layers 2, 3, 5 are arranged separately; the metal layer 3 is provided with an extended portion 4 for external connection; a voltage source is provided for LED. The metal layers 2, 3, 5 are welded separately onto the electrical connection point so that external voltage source is fed to LED chip.

However, owing to inferior structural design of the substrate structure, the strength of welding point is insufficient, so the substrate may be possibly stripped from the circuit board 16 after a period of time, or broken off in the swinging movement, leading to poor contact or breaking of the circuit and failure of entire LED unit.

Thus, to overcome the aforementioned problems of the prior art, it would be an advancement if the art to provide an improved structure that can significantly improve the efficacy.

Therefore, the inventor has provided the present invention of practicability after deliberate design and evaluation based on years of experience in the production, development and design of related products.

SUMMARY OF THE INVENTION

The major purpose of the present invention is to provide a LED packaging structure with blind hole welding device, wherein the electroplated metal layer is placed within the blind hole, enabling improved electrical transmission of electrical connection point after welding. The other purpose of the present invention is to provide a LED packaging structure with blind hole welding device, wherein the blind hole is arranged at the bottom of the packaging body; LED is welded onto the circuit substrate through metal layer in the blind hole, so that it can be firmly positioned on the circuit substrate.

For these purposes, the present invention relates generally to a LED packaging structure, and more particularly to an innovative one designed with blind hole welding device. It at least comprises: a packaging body, which is provided with a wiring substrate; metal layers are separately arranged at both sides for coating the wiring substrate; the metal layers are divided into three portions according to the electrical connection point; a single or a plurality of blind holes arranged at bottom of the wiring substrate, and then connected with the metal layer; a single or a plurality of LED chips arranged onto the wiring substrate; a colloid coated on the LED chip; the packaging body is welded directly onto the substrate for electrical connection, so that LED chip is highlighted. The blind hole is arranged to facilitate the welding, helping to improve the electrical connection and welding performance.

DETAILED DESCRIPTION OF THE INVENTION

The features and the advantages of the present invention will be more readily understood upon a thoughtful deliberation of the following detailed description of a preferred embodiment of the present invention with reference to the accompanying drawings.

FIG. 2 depicts a perspective view of LED packaging structure with blind hole welding device, wherein it comprising: a packaging body 10, onto which a circuit substrate 101 is arranged; metal layer one, two and three 102, 103, 106 are separately arranged at both sides of the circuit substrate 101; the lightweight and thin-profile metal layer 102, 103, 106 is used to cover securely both sides of the circuit substrate 101; a plurality of blind holes 11 is arranged at bottom of the circuit substrate 101; the blind hole 11 is electrically connected with metal layer two 103 via a linking portion 104, and the voltage source is transmitted through metal layer one, two and three 102, 103, 106 at both sides. A LED chip 12, arranged onto the wiring substrate 101, a colloid 14, coated on the LED chip for protection purpose; the blind hole 11 may be arranged at the bottom of wiring substrate in the form of semi-circular, semi-rectangular or semi-elliptical shape.

FIG. 3 depicts another application view of LED packaging structure with blind hole welding device, wherein the blind hole is arranged at the bottom of the wiring substrate 101 in the form of semi-rectangular shape 105, and a metal layer is electroplated into the blind hole for better conductibility.

FIG. 4 depicts a welding view of LED packaging structure with blind hole welding device, wherein the circuit board 16 of the present invention is welded via a solder 18 with the metal layer 102, 103, 106 and blind hole 11, so that the packaging body 10 can be firmly arranged on the circuit board 16 without shedding, thus ensuring lower manufacturing cost for mass production.

The above is a detailed description of the technical features of the present invention based on a typical preferred embodiment. However, it should be appreciated that the present invention is capable of a variety of embodiments and various modifications by those skilled in the art, and all such variations or changes shall be embraced within the scope of the following claims.

Figure 1:
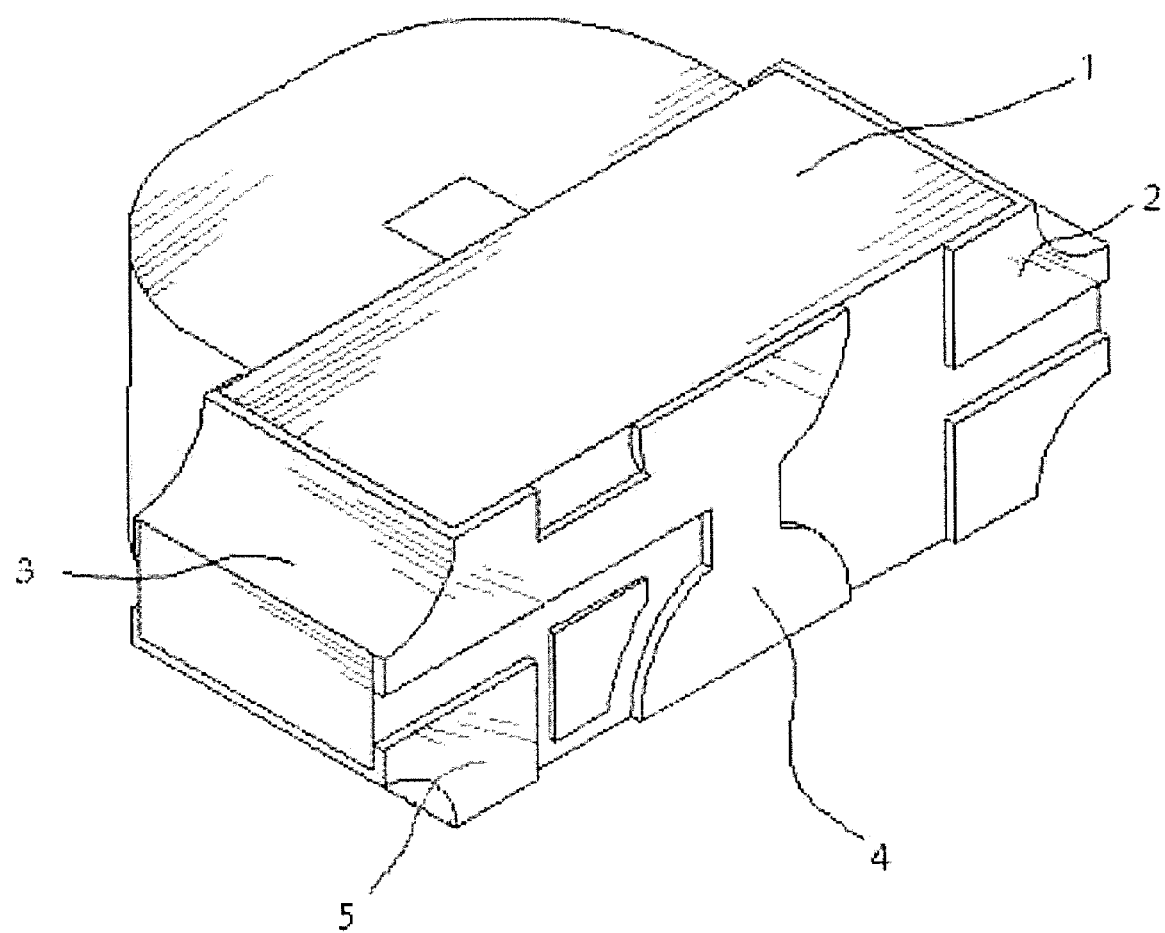
FIG. 1 depicts a view of prior art.
Figure 2:
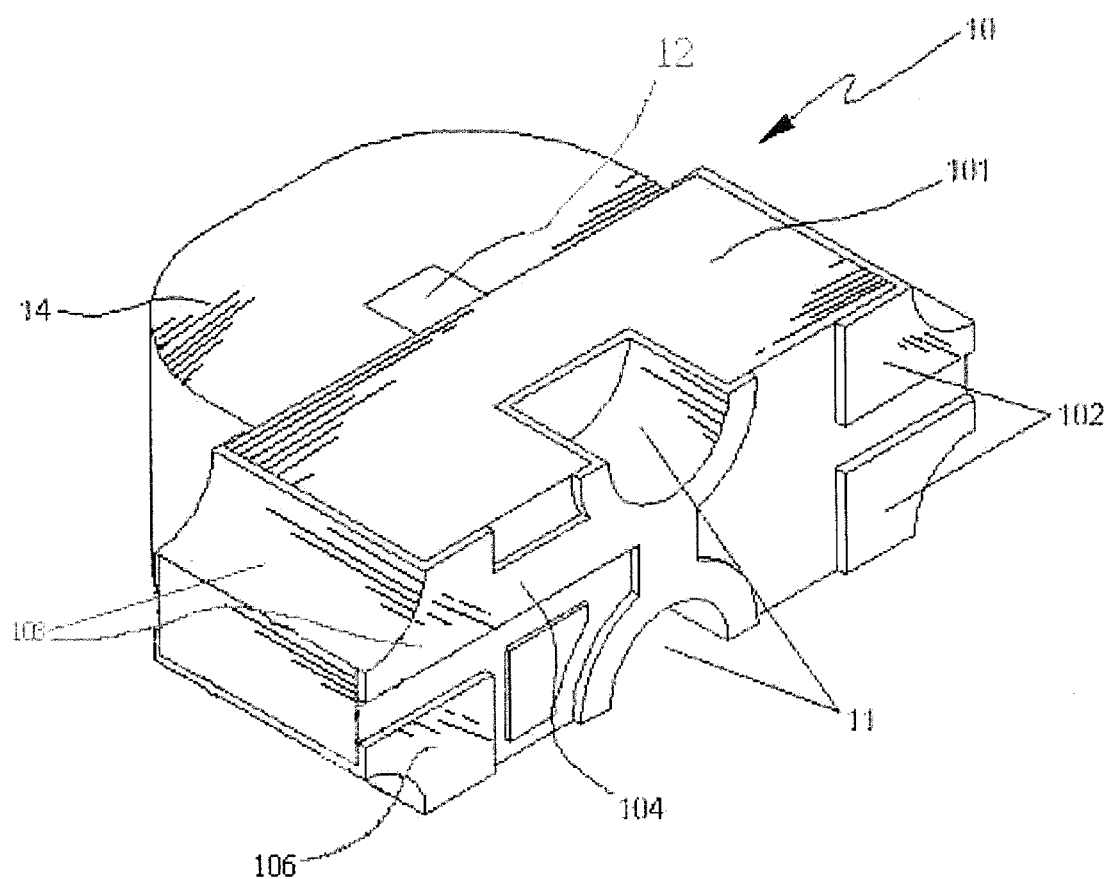
FIG. 2 depicts a perspective view of LED packaging structure of the present invention with blind hole welding device.
Figure 3:
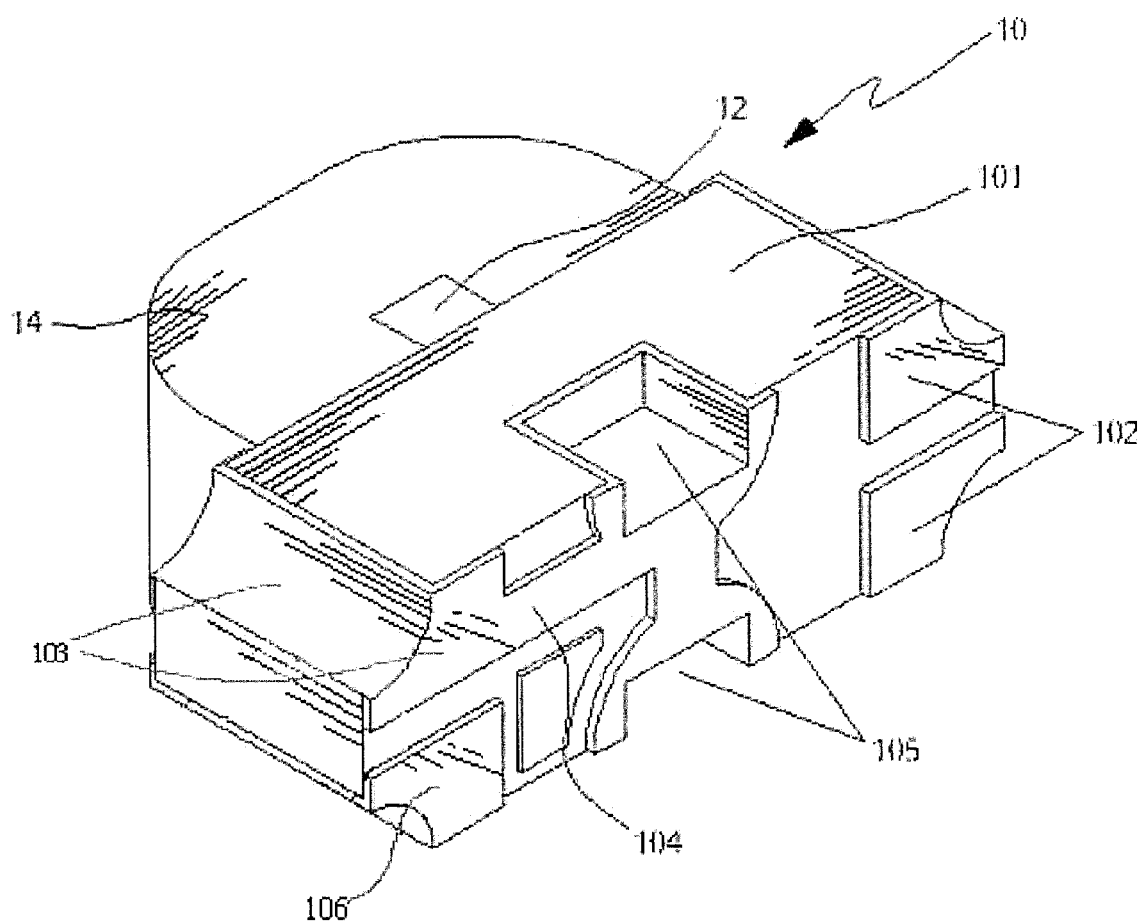
FIG. 3 depicts another application view of LED packaging structure of the present invention with blind hole welding device.
Figure 4:
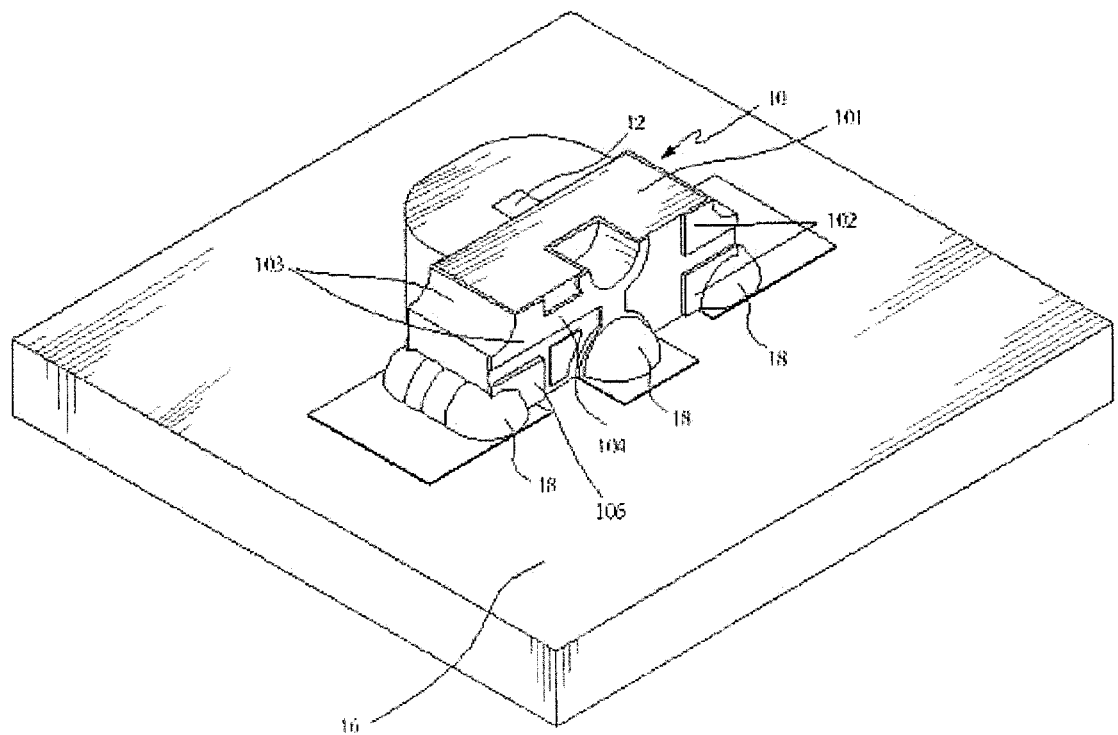
FIG. 4 depicts a welding view of LED packaging structure of the present invention with blind hole welding device.

The invention claimed is:

1. A LED packaging structure with blind hole welding device, comprising:
   a packaging body, provided with a wiring substrate; a plurality of metal layers separately arranged overlaying different sides of the wiring substrate according to respective electrical connection points thereof;
   at least one blind hole portion arranged at a bottom of the wiring substrate and connected to at least one of the metal layers, said blind hole portion being recessed into the wiring substrate from a surface edge thereof;
   at least one LED chip arranged onto the wiring substrate; and a colloid coated on the LED chip.

2. The structure defined in claim 1, wherein the blind hole portion is arranged at the bottom of the wiring substrate in a semi-circular, semi-rectangular, or semi-elliptical shape.

3. The structure defined in claim 2, wherein a metal layer is electroplated within the blind hole portion.

4. The structure defined in claim 1, wherein at least one blind hole portion is formed at each of opposing top and bottom surfaces of the wiring substrate.

5. A LED packaging structure with blind hole welding device, comprising:
- a packaging body including a wiring substrate; a plurality of metal layers separately arranged overlaying different sides of the wiring substrate according to respective electrical connection points thereof;
- at least one blind hole portion arranged at a bottom of the wiring substrate and connected to at least one of the metal layers, the blind hole portion lining in conformed manner a depression in the wiring substrate; and,
- at least one LED chip arranged onto the wiring substrate; and a colloid coated on the LED chip.

6. The structure defined in claim 5, wherein the blind hole portion is arranged at the bottom of the wiring substrate in a semi-circular, semi-rectangular, or semi-elliptical shape.

7. The structure defined in claim 6, wherein the blind hole portion includes an electroplated metal layer.

8. The structure as defined in claim 5, wherein a plurality of the blind hole portions are respectively arranged at opposed top and bottom surfaces of the wiring substrate.

* * * * *